(12) United States Patent
Mirafzal et al.

(10) Patent No.: US 7,081,760 B2
(45) Date of Patent: Jul. 25, 2006

(54) METHOD OF DIAGNOSING A BROKEN BAR FAULT IN AN INDUCTION MOTOR

(76) Inventors: Behrooz Mirafzal, 722 N. 13th St., #309, Milwaukee, WI (US) 53233; Nabeel Aly Omar Demerdash, 13515 W. Wembly Ct., New Berlin, WI (US) 53151

( * ) Notice: Subject to any disclaimer, the term of this patent is extended or adjusted under 35 U.S.C. 154(b) by 10 days.

(21) Appl. No.: 10/889,199

(22) Filed: Jul. 12, 2004

(65) Prior Publication Data
US 2006/0006879 A1 Jan. 12, 2006

(51) Int. Cl.
*G01R 31/34* (2006.01)
*G01R 31/06* (2006.01)
*G01R 31/00* (2006.01)

(52) U.S. Cl. .................. 324/545; 324/772; 324/76.77; 324/86; 702/57; 702/58

(58) Field of Classification Search ................ 324/772, 324/545, 86
See application file for complete search history.

(56) References Cited

U.S. PATENT DOCUMENTS

| | | | |
|---|---|---|---|
| 4,808,932 A | 2/1989 | Schulz, Jr. et al. ......... 324/545 |
| 5,049,815 A | 9/1991 | Kliman ....................... 324/158 |
| 5,252,915 A * | 10/1993 | Sedding et al. ............. 324/772 |
| 5,514,978 A * | 5/1996 | Koegl et al. ................. 324/772 |
| 5,519,337 A * | 5/1996 | Casada ........................ 324/772 |
| 5,523,701 A * | 6/1996 | Smith et al. ................. 324/772 |
| 5,796,258 A * | 8/1998 | Yang ........................... 324/522 |
| 6,262,550 B1* | 7/2001 | Kliman et al. ............... 318/565 |
| 6,308,140 B1* | 10/2001 | Dowling et al. ............. 702/60 |
| 6,421,618 B1* | 7/2002 | Kliman et al. ................ 702/58 |
| 6,518,770 B1* | 2/2003 | Childs ......................... 324/545 |
| 6,611,771 B1* | 8/2003 | Habetler et al. .............. 702/58 |
| 6,650,122 B1* | 11/2003 | Matthews et al. .......... 324/545 |

* cited by examiner

*Primary Examiner*—Anjan Deb
*Assistant Examiner*—Marina Kramskaya
(74) *Attorney, Agent, or Firm*—Andrus, Sceales, Starke & Sawall, LLP

(57) ABSTRACT

A method for diagnosing induction motor broken bar faults using the resultant magnetic field pendulous oscillation phenomenon is disclosed. Broken bar faults cause the resultant magnetic field of an induction motor to possess a pendulous oscillation modulating its inherent rotation at synchronous speed, and the range of this angular pendulous oscillation, referred to as the swing angle, increases with an increase in the number of broken bars. The angular pendulous oscillation is determined by calculating the space vectors derived from motor terminal voltages and currents. The variation in the angular difference between these two space vectors versus time is used to observe the resultant magnetic field's pendulous oscillation, and thus provide on-line rotor fault diagnostics.

16 Claims, 10 Drawing Sheets

METHOD OF DIAGNOSING A BROKEN BAR FAULT IN AN INDUCTION MOTOR

TECHNICAL FIELD

The field of the invention is electrical machinery fault diagnostics and in particular it relates to the detection of rotor faults in induction motors.

BACKGROUND OF THE INVENTION

Industrial users of induction motors are interested in finding reliable procedures for rotor fault detection and diagnostics, since a sudden motor failure may be very damaging or catastrophic in an industrial system, in which the electric motor is a prime mover. These motor failures can force expensive shutdowns of factory production and consequently reduce productivity. Hence, maintenance schedules are provided to proactively reduce or prevent these failures. Nevertheless, the probability of a sudden motor failure cannot be entirely ruled out. Moreover, increasing the frequency of scheduled maintenance increases the cost and decreases the productivity of a system. Accordingly, an online fault diagnostic system becomes a valuable tool to increase industrial productivity and process reliability.

Accordingly, different methods have been investigated and reported to detect rotor faults in induction motors that either make use of off-line detectors or require installing an additional tool in an induction motor. These methods require speed (or slip) measurement (or determination) or require knowledge of other motor parameters. For example, U.S. Pat. No. 4,808,932 discloses a broken bar detector that requires the installation of a flux coil wound on one of the stator teeth of an induction motor. This requires motor disassembly, unless the flux coil is installed at the time of manufacturing or rewinding. Moreover, this special arrangement increases the cost and decreases the reliability of the diagnostic system.

U.S. Pat. No. 5,049,815 discloses a broken bar detector that requires an accurate determination of the motor slip frequency. Determining slip frequency, from monitoring the current drawn by a motor in order to track the side band components as an index for fault diagnostic, reduces the reliability of the diagnostic system particularly for induction motor-drive systems, where the supply frequency varies by a closed loop control-drive system.

U.S. Pat. No. 6,650,122 discloses a rotor analyzer which requires an electromagnetic coil. Basically this analyzer is not an on-line detector, but instead checks a rotor that is not installed within a motor's stator housing.

SUMMARY OF THE INVENTION

It is an object of the present invention to provide a method and apparatus for diagnosing conductive discontinuities in the bars of rotors in induction motors, which is on-line and does not require motor disassembly or service interruption.

It is another object to provide a rotor fault diagnosing tool, which does not require any additional sensor or device to a motor or motor-drive system, thus utilizing the motor monitoring and data processing capabilities already residing in the drive.

It is still another object to provide a rotor fault diagnosing tool, which does not require motor slip or speed measurement (or determination) within the diagnostic system.

It is yet another object to provide a rotor fault diagnosing tool, which does not require knowledge of any motor parameters such as motor inductances (reactances) and/or resistances.

Another object is to provide a rotor fault diagnosing tool, which is non-invasive of the motor operating environment.

In accordance with the above objects, there is provided a method and apparatus for diagnosing rotor broken bar faults in an induction motor operating at steady state. This method and apparatus is based on a rotor's magnetic field pendulous oscillation phenomenon. This phenomenon indicates the rotor magnetic field orientation has a pendulous oscillation due to the presence of a broken bar fault modulating its main motion at synchronous speed. Moreover, the more the severity of the fault in the rotor cage, the wider the range for the resulting pendulous oscillation of the rotor magnetic field orientation. This oscillation in the rotor magnetic field affects the resultant magnetic field in a similar modulating manner, which can be detected by measuring a so-called "swing angle" signal. The swing angle is the angle of the space vector of the poly-phase terminal currents with respect to the angle of the space vector of the poly-phase terminal voltages. In order to obtain the swing angle, the signals of terminal currents and voltages are digitized, stored and digitally processed using a space vector formulation. This process leads to the computation of the fundamental component of the swing angle, which is used as an index for rotor fault diagnosis. The purpose of use of this fundamental component is to reduce the effects of inherent measurement instrumentation and environmental noises. Thus, use of this fundamental component adds to the reliability, and robustness, of the present diagnostic system. The digital tracing process of the fundamental component of the said angle is achieved in a narrow range at low frequency.

The peak to peak of the swing angle signal indicates the degree of severity of a rotor cage fault (defect). If no significant oscillation is found, the rotor is declared to be fault-free. However, if the swing angle amplitude is found to be greater than a predetermined threshold for healthy motors depending on a given class of such motors, then the swing angle amplitude indicates the presence of a defect or fault in the rotor cage. Further an even larger swing angle amplitude provides an indication of the severity of such a rotor fault.

DETAILED DESCRIPTION OF THE INVENTION

A well established principle is that magnetic fields rotate at synchronous speed in an induction motor. However, the rotor magnetic field and consequently the resultant magnetic field will have a pendulous oscillation superposed on its main motion at synchronous speed, when there is a rotor broken bar fault or a rotor bar defect. The frequency of this pendulous oscillation is equal to twice the slip frequency, which is typically less than 10% of the supply frequency. Moreover, the range (or peak to peak) of this oscillation (swing) increases with a corresponding increase in the number of broken bars or rotor bar defects. The magnitude of this pendulous oscillation and its- frequency are introduced and used in the present invention for induction motor rotor fault diagnostics.

The rotor magnetic field pendulous oscillation phenomenon is further described in Mirafzal and Demerdash, "Induction machine broken-bar fault diagnosis using the rotor magnetic field space-vector orientation", IEEE Transaction on Industry Applications., Vol. 40, pp. 534–542, March/April 2004, and Mirafzal and Demerdash, "Induction machine broken-bar fault diagnosis using the rotor magnetic field space vector orientation", Proceedings of the 38$^{th}$ IEEE-IAS Annual Meeting, Salt Lake City, Utah, October 2003, Vol. 3, pp. 1847–1857.

Figure 1:
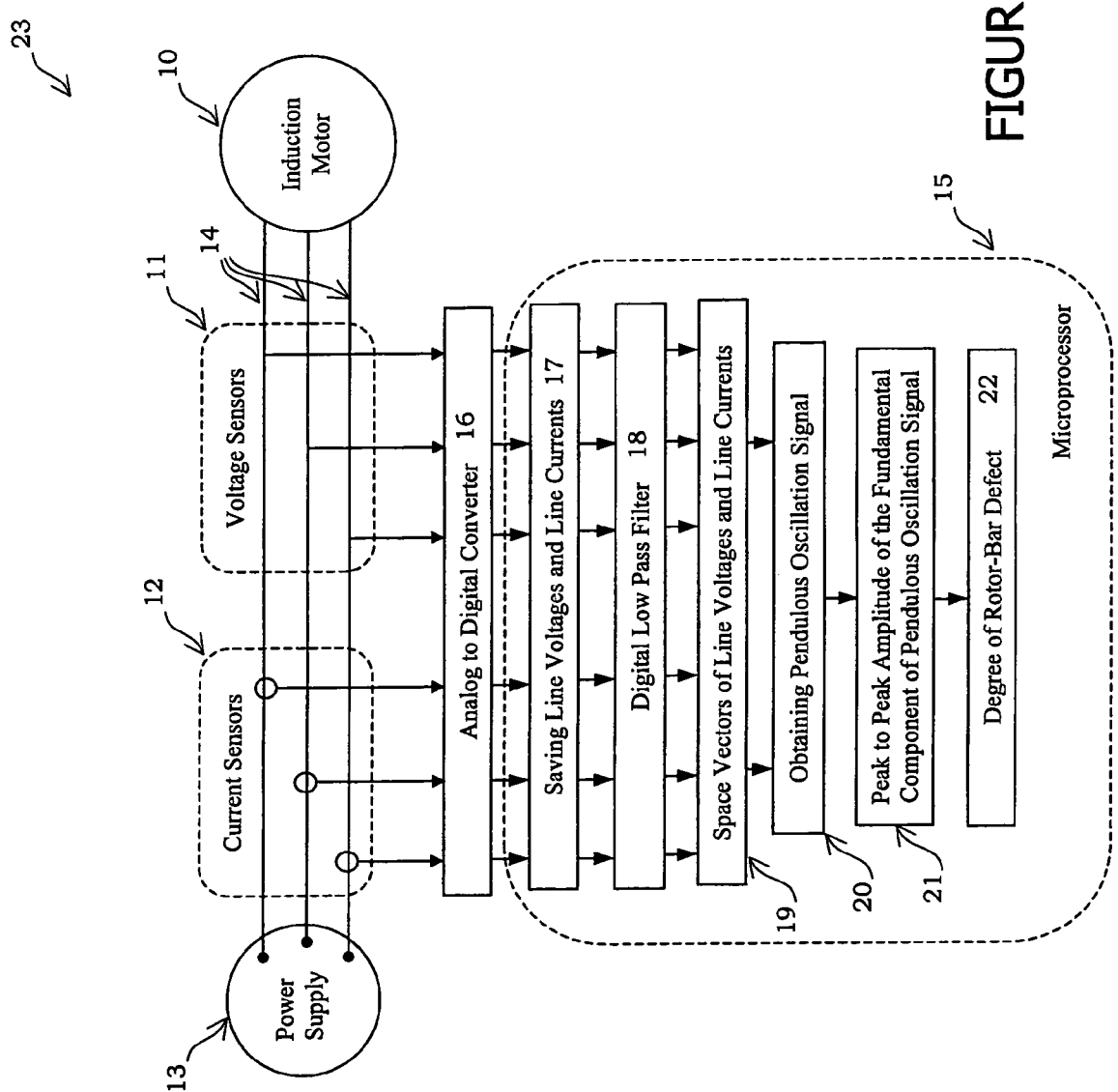
FIG. 1 is a circuit block diagram schematically illustrating a rotor broken bar fault diagnostics apparatus constructed in accordance with the present invention.
Figure 2:
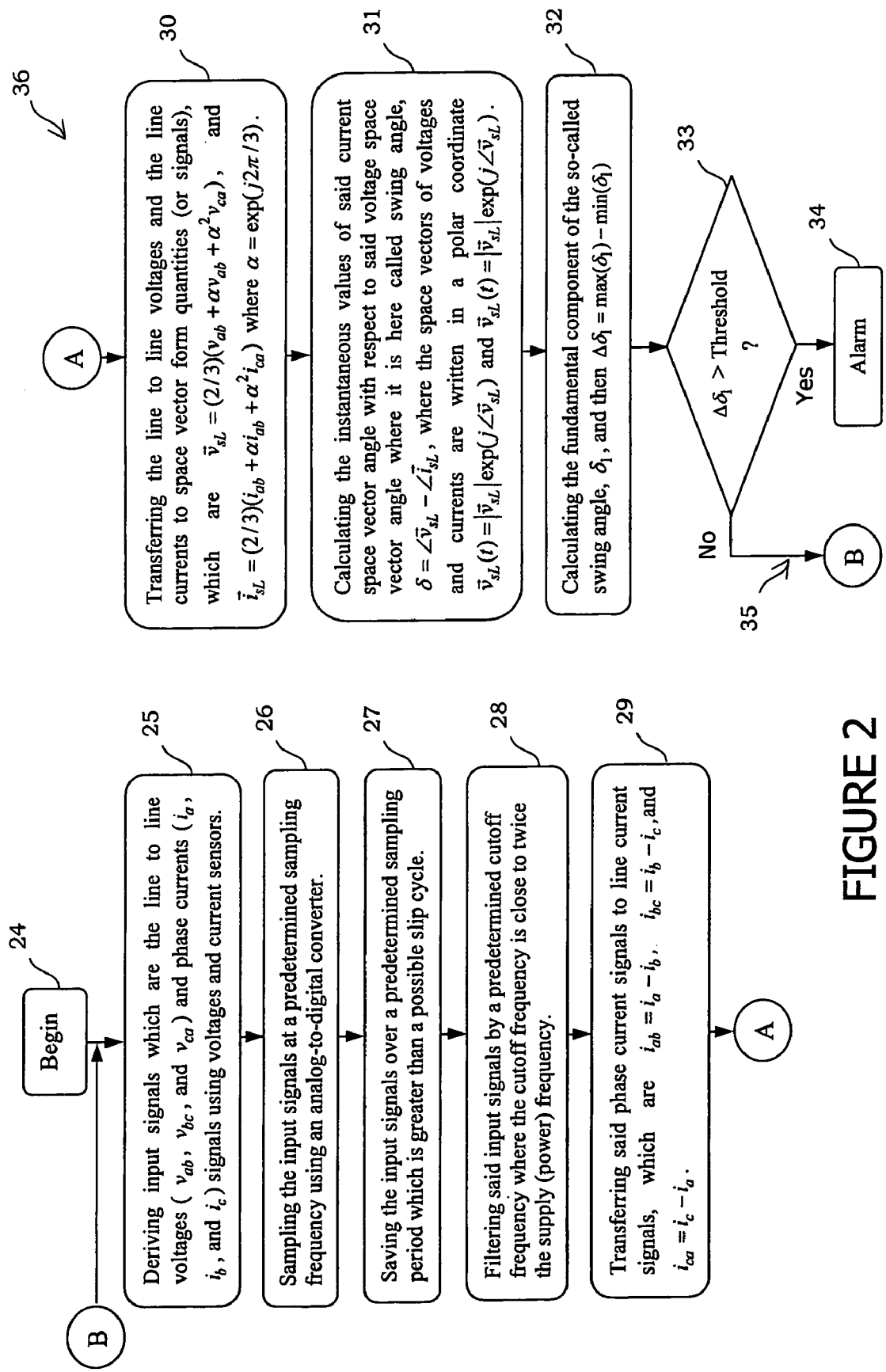
FIG. 2 is a flow chart illustrating the method for rotor broken bar fault diagnostics in accordance with the present invention utilizing the apparatus of FIG. 1.

The diagnostic system of the present invention and its associated algorithm are generally indicated in FIG. 1 and FIG. 2, respectively. This system is shown here in its application to detect rotor broken bar faults in an induction motor 10. The motor 10 draws current from an AC power supply (source) 13. The AC power supply 13 can be a standard three-phase source with a line frequency, e.g. 60 Hz, or a PWM-based voltage (or current) source drive. The line to line motor terminal voltages and phase currents are obtained by voltage sensors 11 and current sensors 12. The voltage sensors 11 are typically precise transformers that step down voltages to an acceptable range for the analog to digital converter 16 in FIG. 1. The current sensors 12 are separate split core current transformers clipped on phase lines 14 at any point in the feed circuit, e.g. at the motor terminals, or can be voltage and current sensors built into the drive electronics. In many cases for a three-phase system, two current sensors and two voltage sensors are sufficient.

The output signals of the voltage and current sensors 11, 12 are sampled, with a common resolution rate, and converted to a series of digital values by an analog to digital converter 16 with a suitable sampling frequency. A suitable sampling frequency (or rate) for a standard power supply (source) 13 with a line frequency, e.g. 60 Hz, can be 4 KHz (4000 samples per second), and the sampling frequency (or rate) in case of a PWM based voltage (or current) source can be four times that of the carrier frequency of the PWM switching process.

The analog to digital converter 16 is coupled to a microprocessor 15 where, in step 17, the sampled data are stored (saved) for a predetermined period which is based on a minimum possible slip cycle. For example, if the motor 10 works in a range of 90 to 100% of its full load then a storing period of two seconds will be amply sufficient. The voltages and currents are filtered digitally by a low pass filter in step 18 with a cutoff frequency. The cutoff frequency is set at a value close to twice the supply (power or line) frequency, for example for a line frequency of 60 Hz, a cutoff frequency of 115 Hz is recommended.

After the low pass filtering, the stored phase currents, $i_a$, $i_b$, and $i_c$, (where $i_b$ is lagging 120 degrees from $i_a$ and $i_c$ is lagging 240 degrees from $i_a$), are used to determine the apparent line currents, $i_{ab}$, $i_{bc}$, and $i_{ca}$, which are defined and calculated as a series of digital values as follows:

$$i_{ab} = i_a - i_b,$$

$$i_{bc} = i_b - i_c, \text{ and}$$

$$i_{ca} = i_c - i_a.$$

Having collected all the line to line voltages ($v_{ab}$, $v_{bc}$, and $v_{ca}$) and the calculated apparent line currents ($i_{ab}$, $i_{bc}$, and $i_{ca}$) from the measured phase currents, the space vectors of these voltages and currents are calculated in step 19 as follows:

$$\vec{v}_{sL} = (2/3)(v_{ab} + av_{bc} + a^2 v_{ca}), \text{ and}$$

$$\vec{i}_{sL} = (2/3)(i_{ab} + ai_{bc} + a^2 i_{ca}).$$

where, $a = \exp(j2\pi/3)$ is the space vector transformation operator.

The next step is to consider the space vector signals in a polar form and subsequently obtain their phase angles, thus:

$$\vec{v}_{sL}(t_k) = |\vec{v}_{sL}| \exp(j \angle \vec{v}_{sL})$$

where, $\angle \vec{v}_{sL} = \arctan(\operatorname{Im}(\vec{v}_{sL})/\operatorname{Re}(\vec{v}_{sL}))$ is obtained as a series of digital values as phase angles of the space vector of the voltage signals. Meanwhile, for the space vector of the apparent line currents:

$$\vec{i}_{sL}(t_k) = |\vec{i}_{sL}| \exp(j \angle \vec{i}_{sL})$$

where, $\angle \vec{i}_{sL} = \arctan(\operatorname{Im}(\vec{i}_{sL})/\operatorname{Re}(\vec{i}_{sL}))$ is obtained as a series of digital values as phase angles of the space vector of the apparent line current signals.

The next step 20 is to calculate the so-called pendulous oscillation signal in terms of the phase angles of the space vectors of voltage and current signals as follows:

$$\delta(t_k) = \angle \vec{i}_{sL}(t_k) - \angle \vec{v}_{sL}(t_k).$$

The obtained series of values for the angle $\delta$ are measured based on either counterclockwise or clockwise direction (not both). One way to guarantee this rule is that any negative value for $\delta$ is replaced by $(\delta + 2\pi)$.

Transferring this signal digitally to a frequency domain and considering a Fourier series expression for $\delta$ as follows:

$$\delta = \angle \vec{i}_s - \angle \vec{v}_s = \Sigma a_h \cos(2\pi f_h t + \phi_h),$$

enables one to obtain the fundamental component of the pendulous oscillation (swing angle) signals (here this is called the information signal, $\delta_1 = a_1 \cos(2\pi f_1 + \phi_1)$). One way of obtaining the information signal is to determine a frequency spectrum of $\delta$ using high resolution (e.g. 0.05 Hz bin size) and then tracking the spectrum for a maximum value for its magnitude. Since the frequency of the fundamental component ($f_1$) is equal to twice the slip frequency, hence tracking the fundamental component is in a predetermined narrow range of frequency, e.g. 0 to 20% of the supply (power) frequency.

Finally, the peak to peak amplitude of the fundamental component of the swing angle is obtained in step 21 simply as follows:

$$\Delta\delta_1 = \max(\delta_1) - \min(\delta_1).$$

This swing angle, $\Delta\delta$, is depicted in a polar coordinate with respect to the absolute-real value of the space vector of the apparent line currents, $|\text{Real}(\vec{i}_{sL})|$, for a test case study motor when operating under healthy rotor condition, and rotor conditions with one, three and five broken bars, as shown in FIG. 3, FIG. 5, FIG. 7, and FIG. 9, respectively.

The time domain profiles (waveforms) of the angles $\delta$ and $\delta_1$ are depicted via display 22 for the motor's healthy rotor operation and its one, three, and five rotor broken bar operations in FIG. 4, FIG. 6, FIG. 8, and FIG. 10, respectively. In these figures the peak to peak swing angle, $\Delta\delta$, and the peak to peak value of the corresponding fundamental component, $\Delta\delta_1$, are clearly depicted respectively by the parallel lines and arrows 46, 47, 57, 58, 69, 70, 81, 82 shown in these figures.

If the $\Delta\delta_1$ is less than a predetermined healthy motor threshold, then the bars are healthy, otherwise there is a broken bar fault or rotor bar defect. Moreover, a larger value for $\Delta\delta_1$ (or $\Delta\delta$) means larger number of broken bars or a more severe fault.

This pendulous oscillation phenomenon can be observed by just measuring the $\Delta\delta = \max(\delta) - \min(\delta)$ 40, 46, 52, 57, 63, 69, 74, 81, however the signal $\Delta\delta_1$ 47, 58, 70, 82 is free of measurement and system noises. This leads one to quantify even the quality (or degree of perfection) of rotor cage manufacturing.

It is apparent from the foregoing that the present invention provides a method and apparatus to diagnose the presence of broken bars in squirrel-cages of poly-phase induction motors without having to monitor any internal motor performance variables. Only the motor terminal voltages and currents need to be monitored, and thus no invasive device or procedure is required. The motor voltages and currents are acquired and digitally processed in a space vector plain from which an information signal of a so-called pendulous oscillation (swing angle) is derived that allows one to quantify and diagnose rotor bar conditions.

The aforementioned on-line process is summarized in the algorithm flow chart 24, 25, 26, 27, 28, 29, 30, 31, 32, 33, 34, 35 of FIG. 2. In this figure a "Yes", $\Delta\delta_1$>threshold 33, leads to triggering an alarm 34.;Meanwhile, a "No" response, 35 leads to an on-line recycling through the algorithm from its beginning 24, in a continuous manner throughout the operation of the motor.

FIG. 3 through FIG. 10, are depicted based on actual test results obtained from a case study motor operating under full load.

Figure 3:
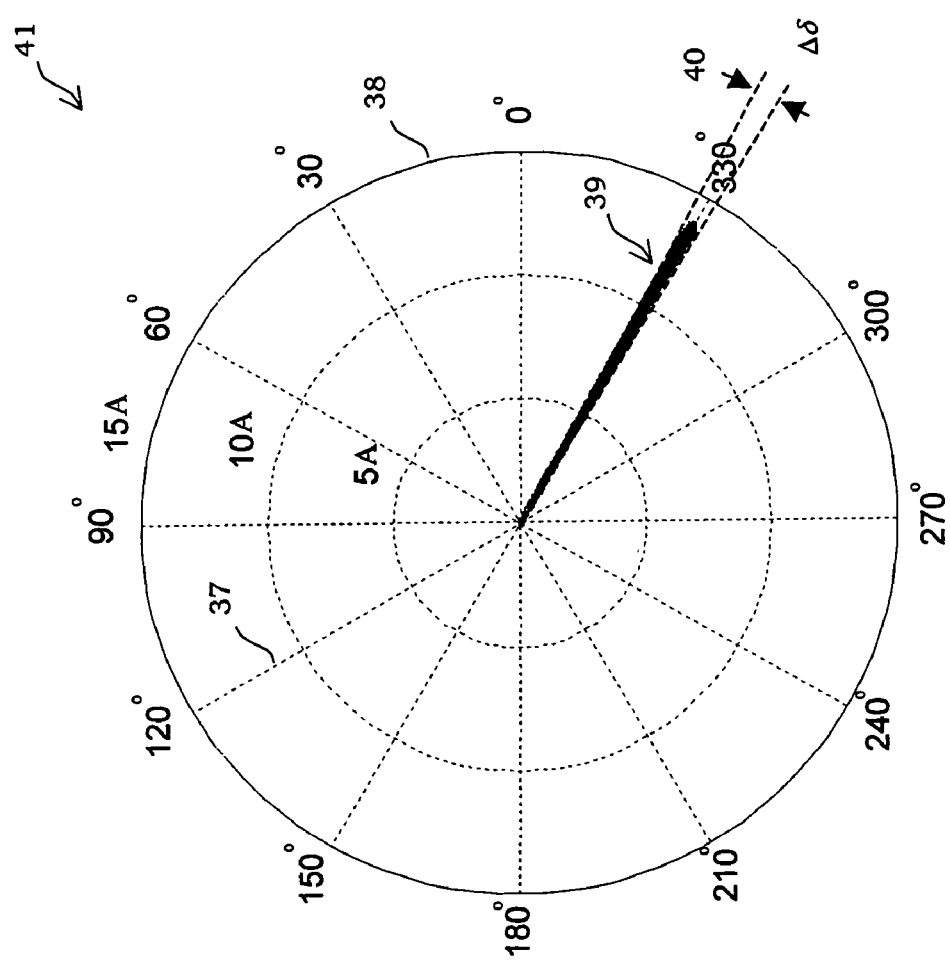
FIG. 3 is a polar coordinate plot of the pendulous oscillation (swing angle) of a healthy rotor cage.

FIG. 3 shows the pendulous oscillation a 39 and the corresponding swing angle $\Delta\delta$ 40 under healthy motor operation. In this figure, the absolute value of $\text{Real}(\vec{i}_{sL})$, that is $|\text{Real}(\vec{i}_{sL})|$ in Amperes, with an orientation equal to the phase $\delta = \angle \vec{i}_{sL} - \angle \vec{v}_{sL}$ in degrees are plotted in a polar coordinate diagram, wherein the radial axis 37 indicates amplitude in Ampere and the circular axis 38 indicates phase angle in degree.

Figure 4:
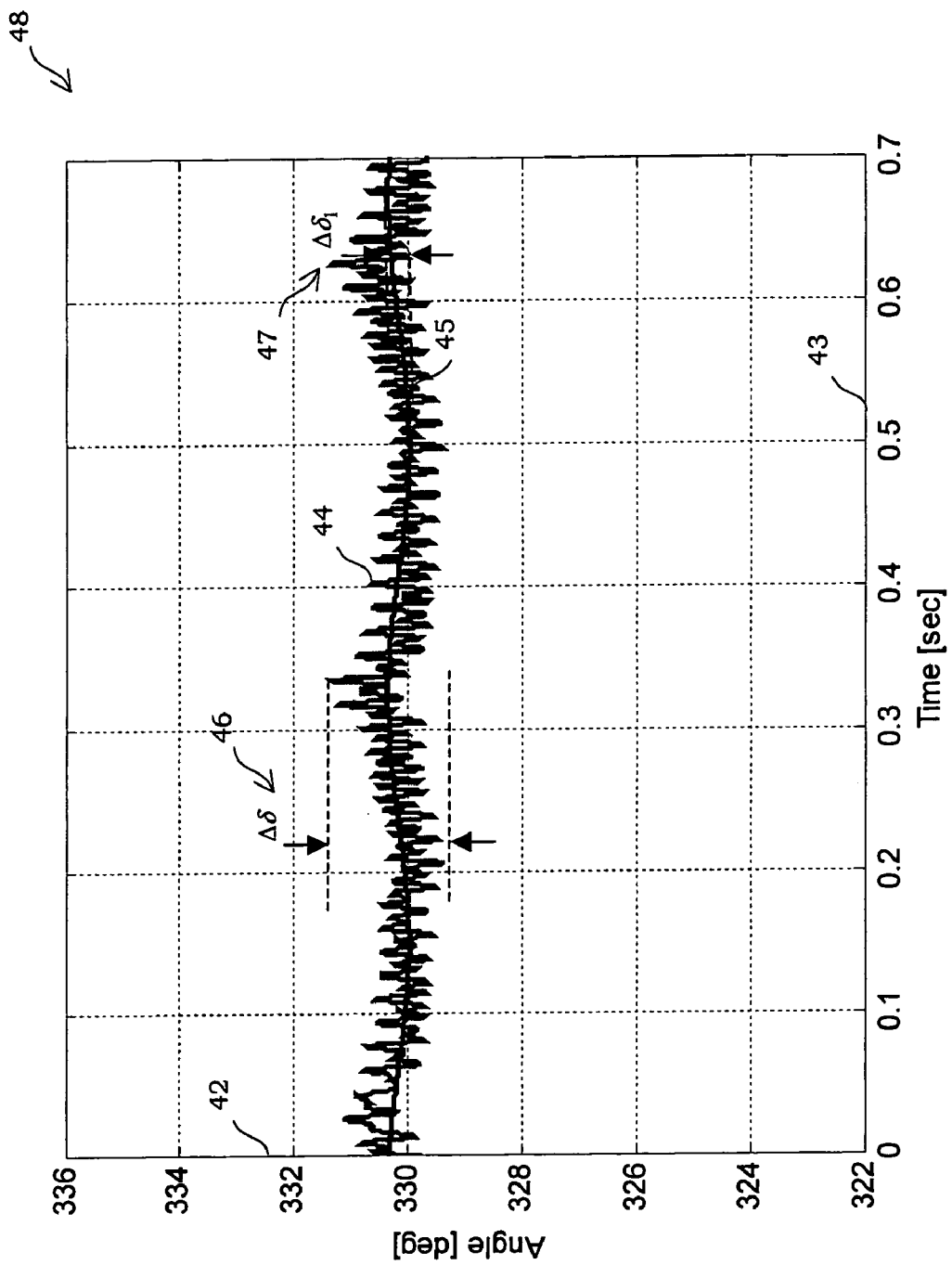
FIG. 4 is a graph of the pendulous oscillation (swing angle) and its fundamental component illustrating a healthy rotor cage.

FIG. 4 shows the pendulous oscillation a 44 and its fundamental component 145 and their corresponding swing angles $\Delta\delta$, 46 and $\Delta\delta_1$ 47 under healthy motor operation in a time domain. In this figure, the vertical axis 42 indicates phase angle in degree and the horizontal axis 43 indicates time in second.

Figure 5:
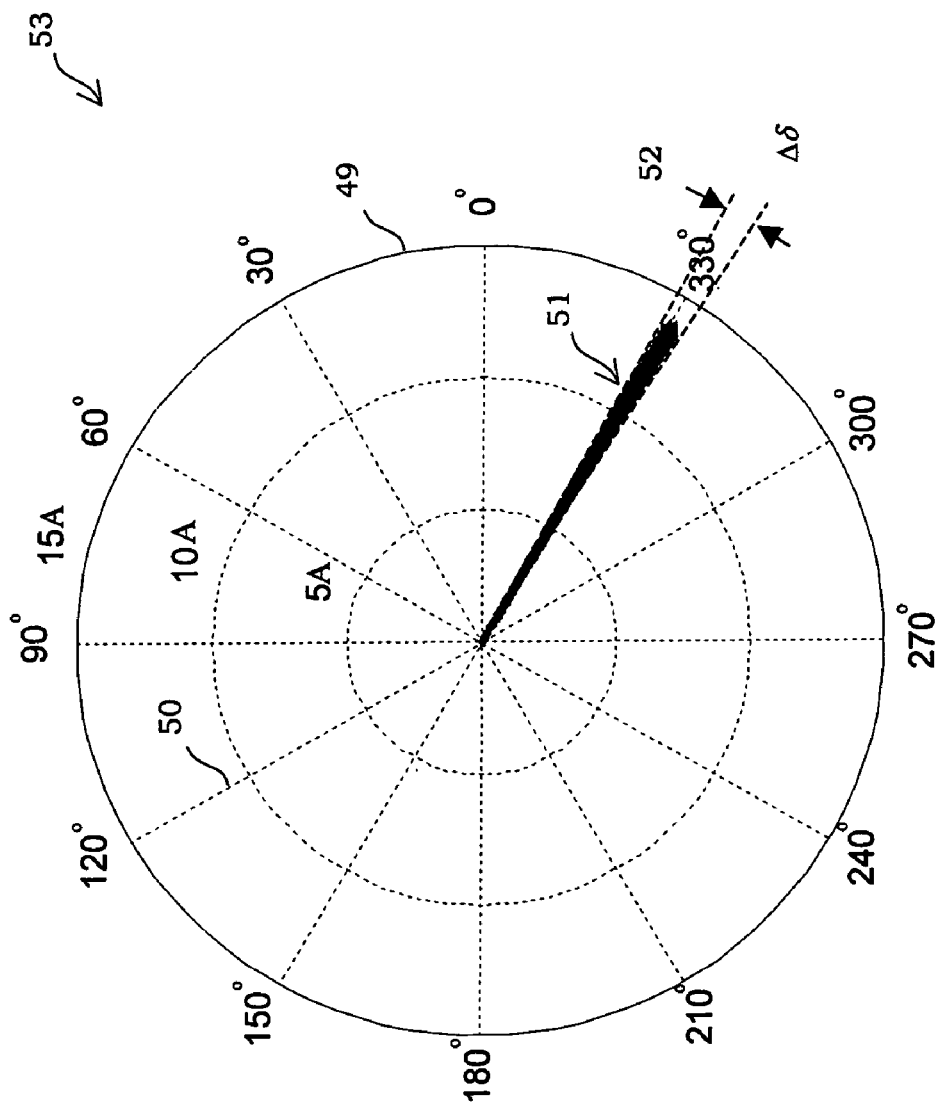
FIG. 5 is a polar coordinate plot of the pendulous oscillation (swing angle) illustrating a one-broken-bars fault.

FIG. 5 shows the pendulous oscillation $\delta$ 51 and the corresponding swing angle $\Delta\delta_1$ 52 under one broken bar fault motor operation. In this figure, the absolute value of $\text{Real}(\vec{i}_{sL})$, that is $|\text{Real}(\vec{i}_{sL})|$ in Amperes, with an orientation equal to the phase $\delta = \angle \vec{i}_{sL} \angle \vec{v}_{sL}$ in degrees are plotted in a polar coordinate diagram, wherein the radial axis 50 indicates amplitude in Ampere and the circular axis 49 indicates phase angle in degree.

Figure 6:
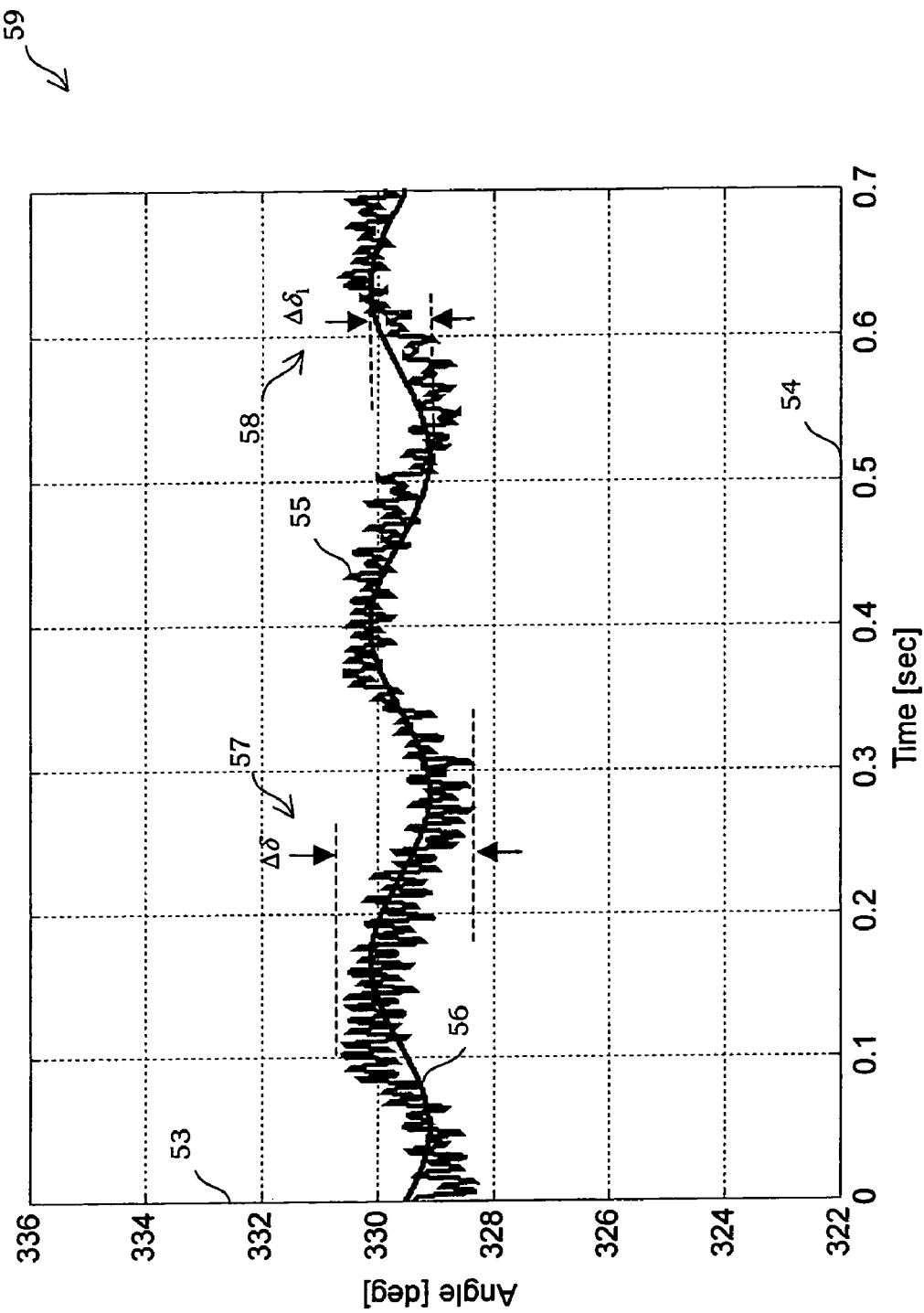
FIG. 6 is a graph of the pendulous oscillation (swing angle) and its fundamental component illustrating a one-broken-bars fault.

FIG. 6 shows the pendulous oscillation $\delta$ 55 and its fundamental component $\delta_1$ 56 and their corresponding swing angles $\Delta\delta$, 57 and $\Delta\delta_1$ 58 under one broken bar fault motor operation in a time domain. In this figure, the vertical axis 53 indicates phase angle in degree and the horizontal axis 54 indicates time in second.

Figure 7:
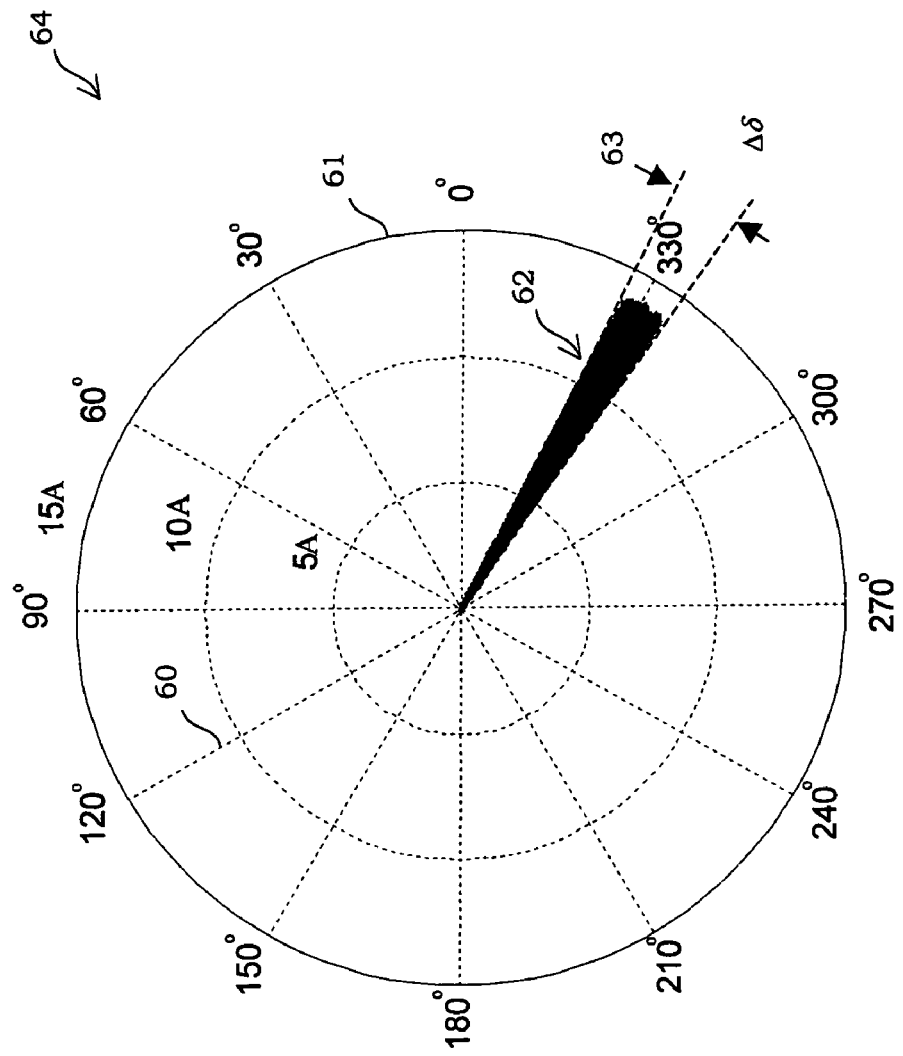
FIG. 7 is a polar coordinate plot of the pendulous oscillation (swing angle) illustrating a three-broken-bars fault.

FIG. 7 shows the pendulous oscillation $\delta$ 62 and the corresponding swing angle $\Delta\delta$ 63 under three broken bars fault motor operation. In this figure, the absolute value of $\text{Real}(\vec{i}_{sL})$, that is $|\text{Real}(\vec{i}_{sL})|$ in Amperes, with an orientation equal to the phase $\delta = \angle \vec{i}_{sL} - \angle \vec{v}_{sL}$ in degrees are plotted in a polar coordinate diagram, wherein the radial axis 60 indicates amplitude in Ampere and the circular axis 61 indicates phase angle in degree.

Figure 8:
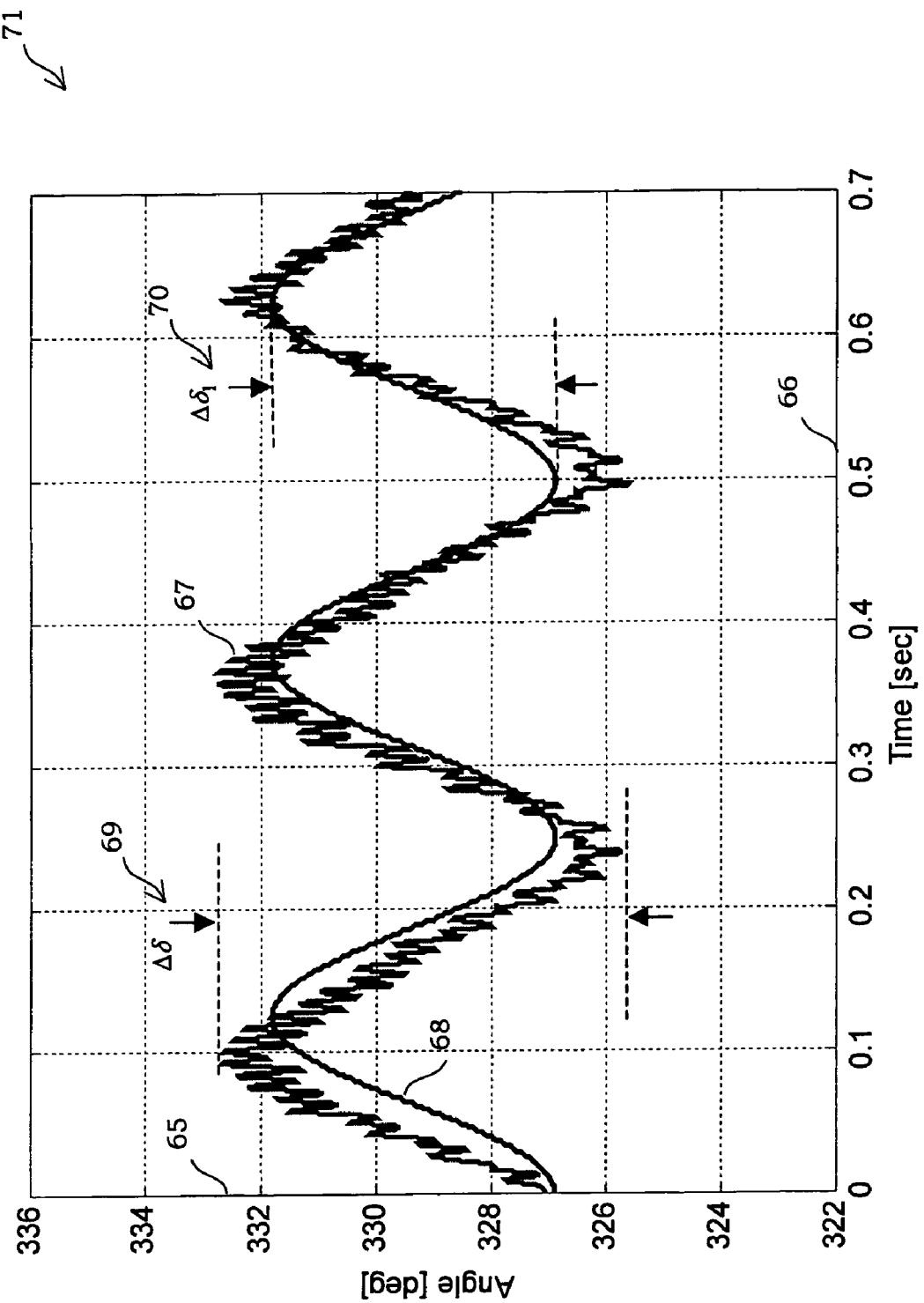
FIG. 8 is a graph of the time-domain profile of the pendulous oscillation (swing angle) and its fundamental component illustrating a three-broken-bar fault.

FIG. 8 shows the pendulous oscillation $\delta$ 67 and its fundamental component $\delta_1$ 68 and their corresponding swing angles $\Delta\delta$, 69 and $\Delta\delta_1$ 70 under three broken bars fault motor operation in a time domain. In this figure, the vertical axis 65 indicates phase angle in degree and the horizontal axis 66 indicates time in second.

Figure 9:
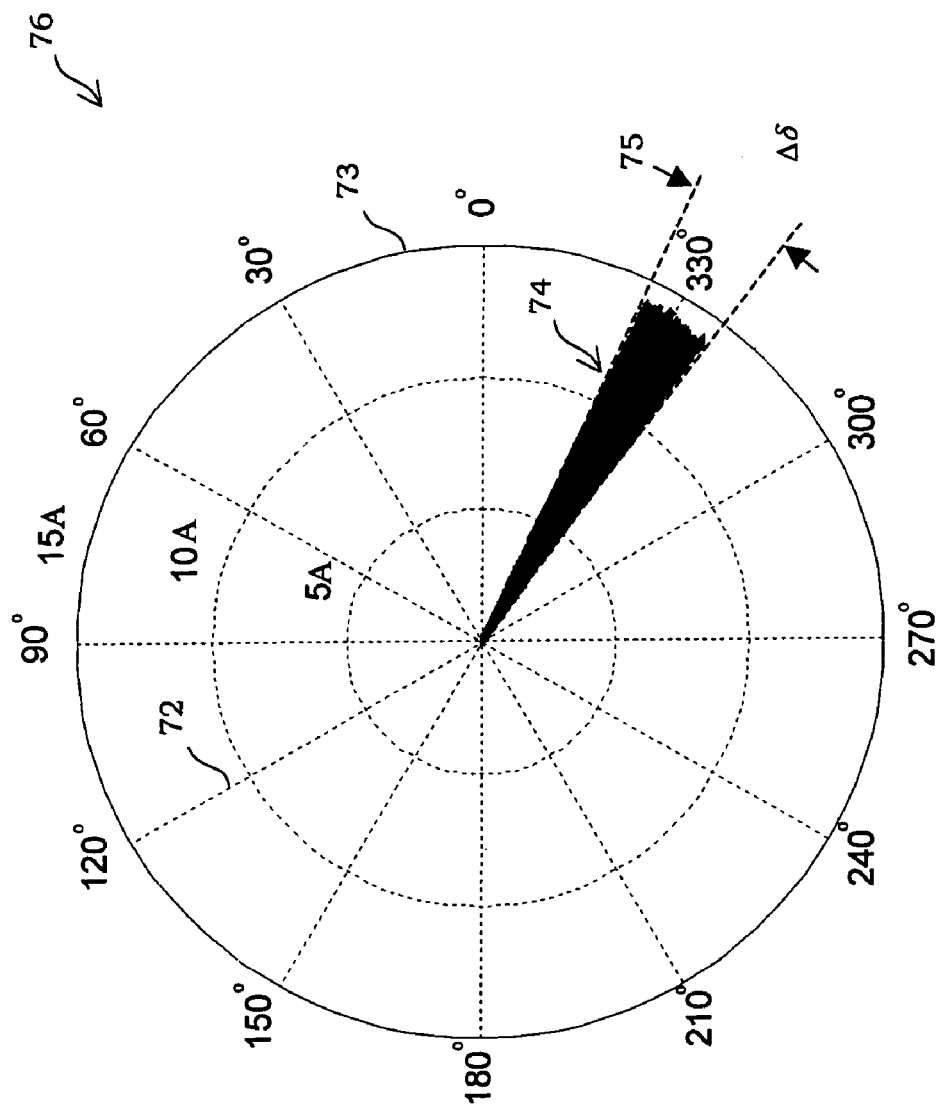
FIG. 9 is polar coordinate plot of the pendulous oscillation (swing angle) illustrating a five-broken-bars fault.

FIG. 9 shows the pendulous oscillation $\delta$ 74 and the corresponding swing angle $\Delta\delta$ 75 under five broken bars fault motor operation. In this figure, the absolute value of $\text{Real}(\vec{i}_{sL})$, that is $|\text{Real}(\vec{i}_{sL})|$ in Amperes with an orientation equal to the phase $\delta = \angle \vec{i}_{sL} - \angle \vec{v}_{sL}$ in degrees are plotted in a polar coordinate diagram, wherein the radial axis 72 indicates amplitude in Ampere and the circular axis 73 indicates phase angle in degree.

Figure 10:
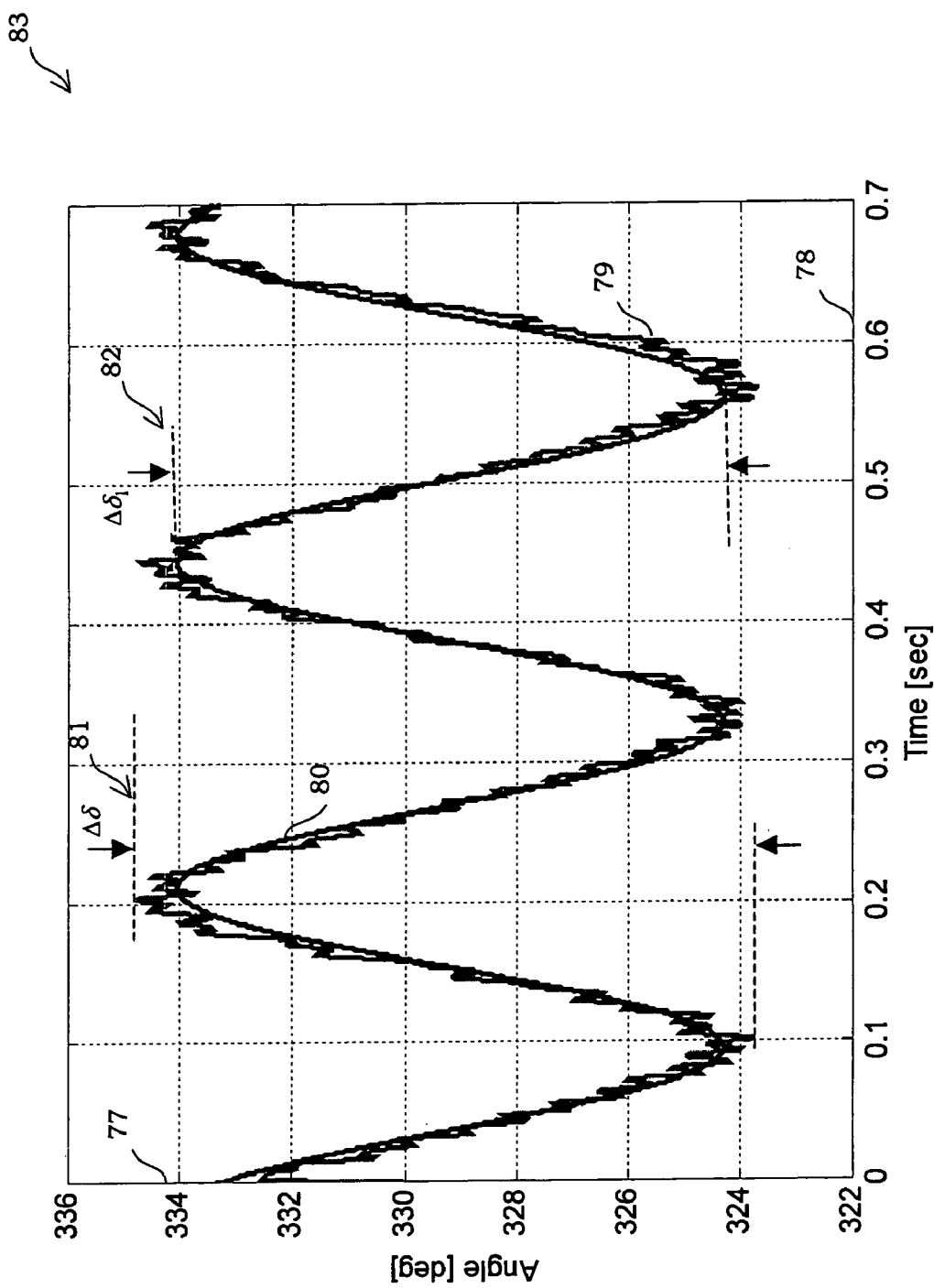
FIG. 10 is a graph of the time-domain profile of the pendulous oscillation (swing angle) and its fundamental component illustrating a five-broken-bars fault.

FIG. 10 shows the pendulous oscillation $\delta$ 79 and its fundamental component $\delta_1$ 80 and their corresponding swing angles $\Delta\delta$, 81 and $\Delta\delta_1$ 82 under five broken bars fault motor operation in a time domain. In this figure, the vertical axis 77 indicates phase angle in degree and the horizontal axis 78 indicates time in second.

These figures show that as the number of broken bars increases the swing angle $\Delta\delta$ and its corresponding fundamental component $\Delta\delta_1$ (fault signature) will increase.

We claim:

1. A method of rotor fault diagnostics in an induction motor, where the motor includes a rotor and a stator, the rotor having a plurality of conductive bars and a stator having multiple phases drawing current from a power supply, the method comprising the steps of:
   detecting the terminal line voltage signals and phase current signals during operation of the motor;
   acquiring the voltage signals and the current signals at a predetermined sampling frequency;
   storing the sampled signals for a predetermined period;
   filtering the voltage and current signals by a predetermined cuttoff frequency;
   converting the phase current signal to apparent line current signals;

converting the line voltage signals and the apparent line current signals into space vector form quantities;

calculating a pendulous oscillation signal from the line voltage space vector angle and the apparent line current space vector angle;

converting the pendulous oscillation signal from a time domain form to a frequency domain form;

determining the fundamental component of the pendulous oscillation signal in the time domain, and its swing angle index, wherein the swing angle index is the peak to peak value of the fundamental component of the pendulous oscillation signal; and activating an alarm when the swing angle index exceeds a predetermined threshold value.

2. The method of claim 1 further comprising the step of saving the sampled voltage signals and the sampled current signals over a predetermined period where the stored data period is greater than the period of a slip cycle.

3. The method of claim 1 wherein the voltage and current signals are derived by voltage and current sensors, each having a common resolution rate.

4. The method of claim 1 wherein the voltage and current signals are sampled at a frequency greater than 4 KHz when the power supply is a direct utility power supply.

5. The method of claim 1 wherein the voltage and current signals are sampled at a frequency greater than four times the carrier frequency when the power supply is a pulse width modulated (PWM) drive.

6. The method of claim 2 wherein the predetermined stored data period is greater than the period of a minimum slip cycle.

7. The method of claim 1 wherein the apparent line current signals are calculated based on the measured phase current signals in a sequence manner such that the phase currents are labeled $i_a$, $i_b$, and $i_c$ and the apparent line currents are $i_{ab}=i_a-i_b$, $i_{bc}$ is equal to $i_b-i_c$ and $i_{ca}$ is equal to $i_c-i_a$.

8. The method of claim 1 wherein the frequency of the fundamental component is equal to twice the slip frequency.

9. The method of claim 1 further comprising the step of determining the number of broken bar faults based on the difference between the calculated swing angle and the predetermined threshold angle.

10. The method of claim 7 wherein the line voltage space vector angle is defined by $\angle \vec{v}_{sL} = \angle(2/3)(v_{ab}+av_{ab}+a^2v_{ca})$ and wherein the apparent line current space vector angle is defined by $\angle \vec{i}_{sL} = \angle(2/3)(i_{ab}+ai_{ab}+a^2i_{ca})$ where $a=\exp(j2\pi/3)$.

11. The method of claim 10 wherein the penduous oscillation signal is defined by $\delta(t)=\angle \vec{v}_{sL} - \angle \vec{i}_{sL}$ and wherein the space vectors of the voltage and currents are written in a polar coordinate by $\vec{v}_{sL}(t)=|\vec{v}_{sL}|\exp(j\angle \vec{v}_{sL})$ and $\vec{i}_{sL}(t)=|\vec{i}_{sL}|\exp(j\angle \vec{i}_{sL})$.

12. A method of rotor fault diagnostics in an induction motor, where the motor includes a rotor and a stator, the rotor having a plurality of conductive bars and a stator having multiple phases drawing current from a power supply, the method comprising the steps of:

detecting terminal line voltages and phase currents during operation of the motor;

generating a voltage signal indicative of the terminal line voltage;

generating a current signal indicative of the apparent line current;

converting the voltage signal and the current signal into space vector form to generate a pendulous oscillation signal, $\delta(t)$, its fundamental component, $\delta_1(t)$, and a swing angle signal index, $\Delta\delta_1$, wherein the swing angle index is equal to the peak to peak value of $\delta_1(t)$; and activating an alarm when swing angle index exceeds a predetermined threshold value.

13. The method of claim 12 wherein the swing angle index, $\Delta\delta_1$, is the broken bar fault indicator which is calculated from the fundamental component of the pendulous oscillation signal $\delta_1(t)$.

14. The method of claim 13 wherein the alarm is activated when the swing angle index exceeds the predetermined threshold value.

15. The method of claim 12 further comprising the step of saving the sampled voltage signal and the sampled current signal over a predetermined stored data period where the stored data period is greater than the period of a slip cycle.

16. The method of claim 12 further comprising the step of determining the severity or number of broken bar faults based on the difference between the calculated swing angle index, $\Delta\delta_1$, and the predetermined threshold angle.

* * * * *